United States Patent [19]

Kraft

[11] Patent Number: 4,520,553

[45] Date of Patent: Jun. 4, 1985

[54] PROCESS FOR MANUFACTURING AN INTEGRATED INSULATED-GATE FIELD-EFFECT TRANSISTOR

[75] Inventor: Wolfgang Kraft, Freiburg, Fed. Rep. of Germany

[73] Assignee: ITT Industries, Inc., New York, N.Y.

[21] Appl. No.: 608,784

[22] Filed: May 10, 1984

[30] Foreign Application Priority Data

May 19, 1983 [DE] Fed. Rep. of Germany ....... 3318213

[51] Int. Cl.³ ............................................. H01L 21/76
[52] U.S. Cl. ....................................... 29/571; 29/578; 29/576 W
[58] Field of Search ................... 29/571, 578; 148/1.5; 357/23 CS, 23 S

[56] References Cited

U.S. PATENT DOCUMENTS

| | | | |
|---|---|---|---|
| 3,899,372 | 8/1975 | Esch et al. | 357/23 CS |
| 4,047,284 | 9/1977 | Spadea | 29/571 |
| 4,080,718 | 3/1978 | Richman | 29/571 |
| 4,135,289 | 1/1979 | Brews et al. | 357/23 CS |

Primary Examiner—Brian E. Hearn
Assistant Examiner—Hunter L. Auyang
Attorney, Agent, or Firm—Donald J. Lenkszus

[57] ABSTRACT

A process is described for manufacturing integrated insulated-gate field-effect transistors comprising contacts on both the source region and the drain region which are self-aligned with respect to the gate electrode. In this process the gate area and the areas of the aforementioned regions are defined by means of an oxidation masking layer, and on these regions by employing the oxidation masking layer, there are produced insulator layers which are relatively thick compared to the gate insulator layer.

2 Claims, 9 Drawing Figures

PROCESS FOR MANUFACTURING AN INTEGRATED INSULATED-GATE FIELD-EFFECT TRANSISTOR

BACKGROUND OF THE INVENTION

The invention pertains to manufacturing insulated-gate field-effect transistors (MISFETs) for use with very large scale integrated circuits (VLSIs).

In keeping with the latest technological developments, it is possible to manufacture very large scale integrated circuits comprising insulated-gate field-effect transistors, whose channel length (L) amounts to approximately 1 μm as is known, for example, from "IEEE Journal of Solid-State Circuits" Vol. SC-15, No. 4 (August 1980) pp. 417 to 423 and the Annual Report on "Semiconductor Technologies, 1982", published by J. Nishizawa, pp. 280 to 295. In particular, processes are used which have a self-alignment feature.

In such processes the gate electrode including its gate-insulating layer is first produced. The gate insulating layer is used as an implantation mask in the course of the process of implanting the dopings in both the source and the drain region. In the Si-gate described in "Electronics" of Sept. 29, 1960, pp. 88 to 94, a diffusion process similarly employs the gate electrode as a diffusion mask. To obtain a self-alignment of the source contact and of the drain contact with respect to the gate electrode, the latter is etched out of an oxidizable material, particularly out of polycrystalline silicon. Following formation of the contacting windows, a contacting layer is deposited. By employing a photolithographic etching process, the contacts including the conductor leads or also the contacting conductor leads are etched out of the contacting layer.

The procedure of using the gate electrode as a mask in manufacturing the source and the drain region, has disadvantages in the manufacture of integrated insulated-gate field-effect transistors for the use with very large scale integrated circuits. These disadvantages become greater as the channel length becomes smaller. It was found that the relative variations of the channel lengths and accordingly the variations in the spacings of the source regions from the respective neighboring drain regions which occur while etching the gate electrode out of a layer of electrode material due to the unavoidable variations during the under-etching of the masking covering the gate electrode area, become greater as the channel lengths become shorter. Thus the smaller the insulated-gate field-effect transistors are made, the greater the relative variation. When using a thinner layer of electrode material, these variations become smaller. However the sheet resistivity of the electrodes and of lead-in conductors consisting of the electrode material, are increased to an undesirable extent. These problems are not remedied by using the electrode material of conventional types of oxidizable silicides for whose conductivity is by a multiple higher than that of doped polycrystalline silicon.

SUMMARY OF THE INVENTION

The invention starts out from the idea of maintaining the procedure of manufacturing contacts self-aligned with respect to the gate electrode during the manufacture of integrated insulated-gate field effect transistors in accordance with the conventional processes as is disclosed in the two aformentioned prior publications. The procedure of manufacturing regions self-aligned with respect to the gate electrode, by employing the gate electrode itself as a mask is dispensed with although with regard to the use of the Si-gate technology, professional experts are of the opinion that just this technology is particularly suitable for the purpose of reducing the size of integrated insulated-gate field-effect transistors, as results, for example, from the article in the aforementioned technical journal "Electronics" of July 19, 1969, on pages 88 to 94.

The invention is based on the recognition that an oxidation masking layer, in particular one of silicon nitride, for restricting the gate area of an insulated-gate field-effect transistor for use with a large-scale integrated circuit is more suitable than, for example, a gate electrode layer of polycrystalline silicon. This is so because, on the one hand, a silicon nitride layer with a layer thickness of about 15 nm completely protects against an oxidation of a silicon substrate but, on the other hand, a layer thickness of 300 nm has to be exceeded for a highly doped Si-gate electrode in order to obtain at least to some extent, useful conductances of both the electrodes and the conductor patterns. This occurs because during the aforementioned under-etching following a masking, a thin layer can generally be etched out with more sharp edges and in a more defined manner than a layer which is relatively thick.

The process known from the German Pat. No. 17 64 401 has been considered. In this process in which the variations of the overlapping capacities of the gate electrode in relation to the source region and the drain region are small due to the relatively great thickness of the insulating layer on these regions, an oxidation masking layer is deposited onto the surface of the substrate of an insulated-gate field-effect transistor. The oxidation masking layer covers the gate area. This is followed by a thermal oxidation process in which the substrate surface, with the exception of the gate area, is oxidized by forming an insulating layer. In this insulating layer of silicon dioxide, diffusion windows corresponding to the areas of both the source region and the drain region are produced on both sides of the oxide masking layer. A process of diffusing the dopings of the regions follows, whereupon the remainders of the insulating layer of silicon dioxide are removed. Thereafter, a thick oxide layer is produced by an oxidation step. Contacting windows are then produced in the insulating layer within the region areas by employing a photolithographic process. Finally all electrodes, including the gate electrode are manufactured by a thermally produced gate oxide following the replacement of the oxidation masking layer covering the gate area.

The process known from the aforementioned German Pat. No. 17 64 401 has not previously been considered for manufacturing integrated insulated-gate field-effect transistors of very large scale integrated circuits. Thus the process according to the invention starts out from the process disclosed in the aforementioned literature. In this process, for manufacturing an integrated insulated-gate field-effect transistor with contacts self-aligned with respect to the gate electrode and attached to a source region and a drain region, which have been introduced into a semiconducting substrate, the gate electrode is coated with insulating material by thermal oxidation. Theareafter, following the manufacture of contact windows in the insulating layers covering the regions, the contacts are attached to the regions which, with respect to the gate electrode, are separated by the insulating material.

It is the object of the invention, in the case of comparably equal dimensions of the gate area, to restrict the latter more sharply in order to be able to realize smaller dimensions.

In the process according to the invention, an oxidation masking layer is deposited which is suitable for serving as an implantation mask. The oxidation masking layer consists of an upper partial layer, preferably of silicon nitride and of a lower partial layer which, compared thereto, is selectively etchable and capable of being used as a gate insulator layer, so that following the removal of the upper partial layer, the material of the gate electrode can be deposited onto the lower partial layer.

Prior to deposition of the oxidation masking layer which is suitable for being used as an implantation mask, and by using a layer suitable only for the purpose of the oxidation masking, the field area outside the region and the gate areas can be oxidized to form a thick oxide layer. Below this thick oxide layer, there may be provided a highly doped layer of the same conductivity type as the substrate for the purpose of increasing the field threshold voltage. For this purpose, ions of the conductivity type of the substrate are implanted, in the conventional way, into the field area, with the region areas and the gate areas of the insulated-gate field-effect transistors of the integrated solid-state circuits, the majority of which is manufactured on a semiconductor wafer to be divided later on, being masked. Such a masking, for example, can be effected with the aid of a photoresist mask.

To provide sharp edges of the image during the first photoresist process with the aid of which the oxidation masking layer covering the gate area is produced, a plane substrate surface should be used in order to avoid dispersions and reflections on uneven surface portions, which are likely to impair the definition of image. For this reason, in the embodiment to be described hereinafter with reference to the accompanying drawings, the thick oxide layer is only manufactured in a later state of the manufacturing process.

BRIEF DESCRIPTION OF THE DRAWINGS

The invention will be better understood from the following detailed description of a preferred manufacturing process in conjunction with the drawings in which.

DETAILED DESCRIPTION

Figure 1:
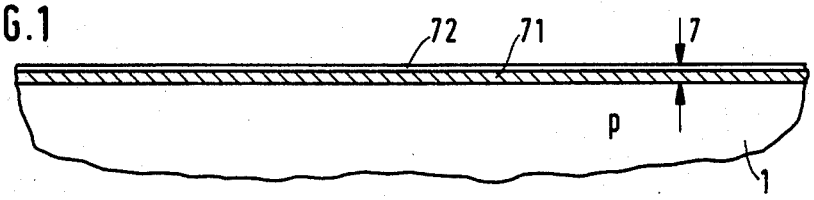
FIGS. 1 to 9 of the accompanying drawings are partial sectional views taken through a plate-shaped Si-substrate of a highly integrated MIS solid-state circuit and serve to illustrate the various stages of manufacture in the course of the process according to the invention.

In FIG. 1 a p-doped substrate 1 of silicon has deposited superficially thereon an oxidation masking layer 7 suitable for being used as an implantation mask for the implantation process illustrated with reference to FIG. 2. Oxidation masking layer 7 includes a lower partial layer 71 which, later on, is used as a gate insulator area 5 (cf. FIG. 8) and which preferably consists of a thermally grown silicon dioxide. On this lower partial layer 71 there is deposited an upper partial 72 of silicon nitride which is effective against the oxidation. Both layers 71, 72 are so dimensioned with respect to their thicknesses that the implantation process as illustrated with reference to FIG. 2, i.e., dopings of the source region 21 and of the drain region 31 (cf. FIG. 3), is masked. The thickness of the entire oxidation masking layer 7, as is well known, depends on the accelerating voltage and of the kind of ions to be implanted. Due to the double structure of the oxidation masking layer 7 and the accelerating voltage which is selectable within wide limits, it is not difficult to deposit an oxidation masking layer 7 which is suitable for use as an implantation mask, with the lower partial layer 71 thereof simultaneously being suitable for use as a gate oxide layer.

Figure 2:
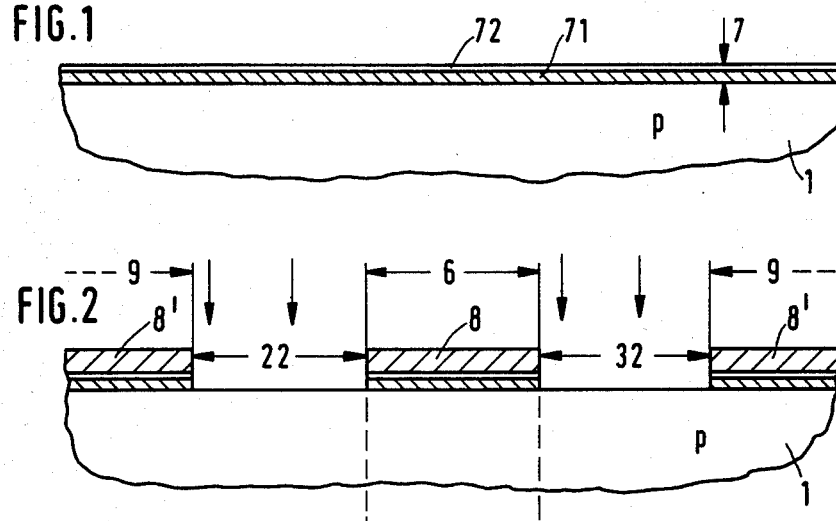

As shown in FIG. 2, a first photoresist mask, 8, 8' is deposited on oxidation masking layer 7 which leaves free the region areas 22 and 32. By using this first photoresist mask as an etching mask, the substrate surface is exposed within the windows of the photoresist mask 8, 8'. Thereafter the implantation process is carried out for implanting the dopings of both the source region and the drain region as shown in FIG. 2.

Figure 3:
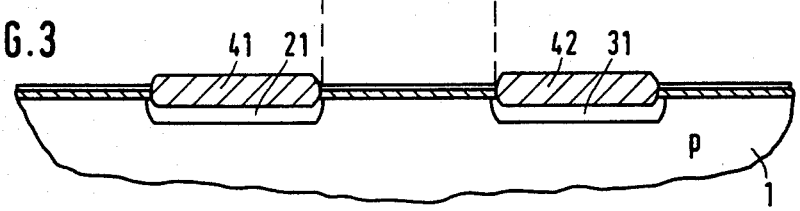

Following this implantation process, a thermal oxidation is carried out to produce insulator layers 41 and 42 covering the region areas 22 and 32 as shown in FIG. 3.

Figure 4:
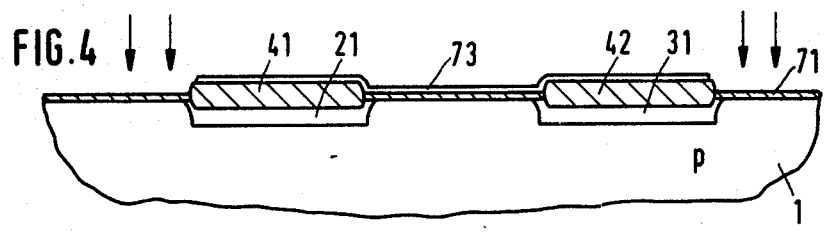

The upper partial layer 72 of the oxidation masking layer 7 consisting of silicon nitride, is removed in the course of an etching process, preferably, in the conventional manner from a reactive gas phase. A further oxidation masking layer 73 is deposited which not only covers the region areas 22 and 32, but also the gate area 6. Next, an implantation of dopings of the conductivity type of the substrate 1 is carried out as illustrated in FIG. 4. The accelerating voltage is chosen such that the lower partial layer 71 is penetrated.

Figure 5:
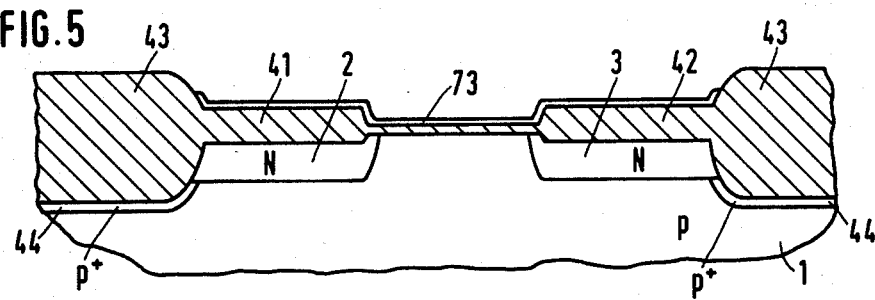

After this, in the conventional way, a thick oxide layer 43, shown in FIG. 5, is produced by way of thermal oxidation. The oxidation of the substrate is preceded by the diffusion of the highly doped layer 44 of the conductivity type of the substrate 1. In the course of this oxidation process, the further oxidation masking layer 73 prevents oxygen from entering into the gate area and the region areas. There is then obtained an arrangement as shown in FIG. 5.

Figure 6:
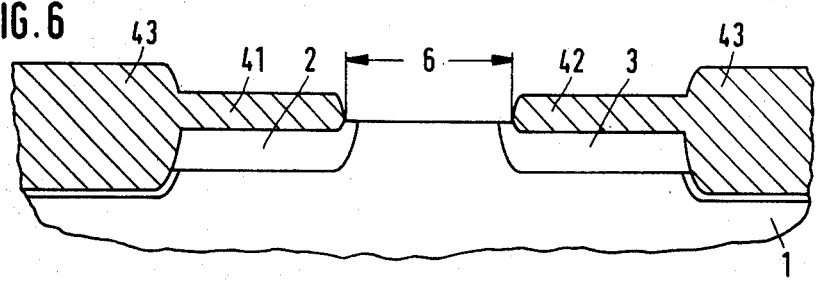
Figure 7:
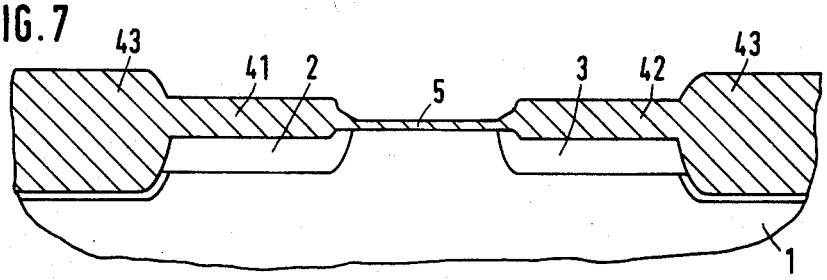

Upon etching away the further oxidation masking layer 73 and exposing the gate area 6, there can now be obtained an arrangement as shown in FIG. 6, in which the gate oxide 5 of FIG. 7 is to be produced by way of oxidation. It is more favorable, however, to deposit an oxidation masking layer 7 consisting of an upper partial layer 72 and of a lower partial layer 71, in which case the lower partial layer 71, in its thickness, is to be dimensioned in such a way that it can be used as a gate insulator layer 5. The upper partial layer 72 consisting of silicon nitride, serves in this case as a protective layer for the guide insulator layer 5 in the course of the preceding oxidation processes.

With respect to the arrangement as shown in FIG. 6, prior to the production of the gate insulator layer 5, it is possible to carry out an implantation within the gate area 6 for adjusting the threshold value and/or the characteristics, in which case both the thick oxide layer 43 and the insulator layer 41 and 42 have masking effects. Such an implantation can also be carried out previously in a preceding stage, for example, prior to the deposition of the further oxidation masking layer 73 (cf. FIG. 4), with the field area being protected by a photoresist mask against the implantation of the ions.

Figure 8:
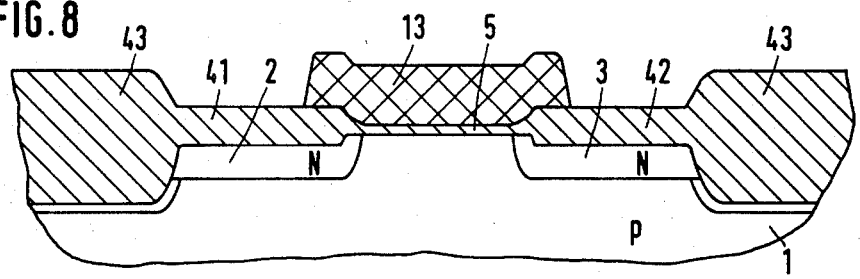

Onto the arrangement as shown in FIG. 7 comprising the gate insulator layer 5 there is now deposited a layer consisting of the material of the gate electrode, such as doped silicon or else also of one of the known silicides, which can be superficially coated with insulating material. From this material layer there is then etched out the gate electrode 13 and the conductor leads which are required, to this end a photoresist mask is deposited onto the material layer. The exposed portions of the material layer are removed preferably in the course of a dry etching process out of the gas phase. After that there will result the arrangement as shown in FIG. 8.

Subsequently, a thermal oxidation process is carried out in the course of which the exposed portions of the gate electrode 13, and, of course, also those of the conductor leads are superficially coated with insulating material 14. This is then followed by a photolithographic etching process for producing the contacting windows for the contacts 11 and 12 at the regions 2 and 3, and at the same time there can also be produced a window at the gate electrode or at the extension thereof, to which the gate contact 10 can be attached.

Figure 9:
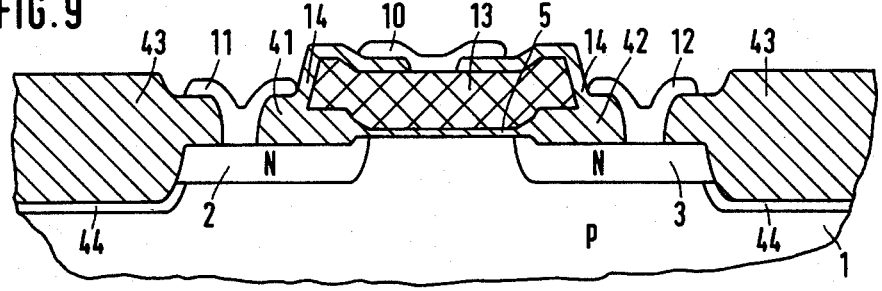

It can be easily seen from FIG. 9 that, due to the self-aligning procedure in manufacturing the contacts 11 and 12 at the regions on the one hand, and towards the gate electrode, on the other hand, the photolithographic etching process for producing the gate electrode 13 is not critical. This photolithographic etching process, however, is also not critical with respect to the overlapping capacities, because the portions of the gate electrode 13 overlapping the insulator layers 41 and 42, due to the latter being substantially thicker than the gate insulator gate 5, do not significantly contribute towards the overlapping capacities.

What is claimed is:

1. A process for manufacturing an integrated MIS field effect transistor including source and drain regions introduced into a semiconducting substrate, contacts at the source and drain regions which are self aligned with respect to a gate electrode, the gate electrode being coated with an insulating material by thermal oxidation, contact windows in the insulating material being provided over the source and drain regions, and contacts in the windows attached to the source and drain regions and separated from the gate electrode by the insulating material, said process comprising the steps of:

depositing on the surface of said substrate an oxidation masking layer suitable for being used as an ion implantation mask, including depositing a lower partial layer and depositing an upper partial layer, said lower partial layer being selectively etchable relative to said upper partial layer and being capable of being used as said gate insulating material;

depositing on said oxidation masking layer a first photoresist mask defining source and drain region areas;

removing said oxidation masking layer from said source and drain region areas;

implanting ions of the respective conductivity type of source and drain into the surface of said substrate in said source and drain region areas to produce said source and drain regions respectively;

producing insulating layers covering said source and drain region areas by thermal oxidation;

removing at least said upper partial layer of said oxidation masking layer;

covering said source and drain region areas and a gate area with a further oxidation masking layer and defining field areas in the uncovered portions of the substrate;

covering the field areas of said substrate lying outside said further oxidation masking layer with a thick oxide layer by way of thermal oxidation;

forming contact windows in said insulating layers with the aid of a photoresist mask; and attaching contacts to said source and drain regions in said contact windows.

2. A process in accordance with claim 1 comprising the steps of:

implanting ions of the substrate conductivity type into said field areas prior to said field area covering step.

* * * * *